(12) United States Patent
Huang

(10) Patent No.: US 10,741,795 B2
(45) Date of Patent: Aug. 11, 2020

(54) PACKAGE STRUCTURE OF ORGANIC LIGHT EMITTING COMPONENT

(71) Applicant: Shenzhen China Star Optoelectronics Technology Co., Ltd., Shenzhen (CN)

(72) Inventor: Hui Huang, Shenzhen (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 15/965,529

(22) Filed: Apr. 27, 2018

(65) Prior Publication Data

US 2019/0198818 A1 Jun. 27, 2019

Related U.S. Application Data

(63) Continuation of application No. PCT/CN2018/077085, filed on Feb. 24, 2018.

(30) Foreign Application Priority Data

Dec. 26, 2017 (CN) .......................... 2017 1 1439706

(51) Int. Cl.
*H01L 51/52* (2006.01)
*H01L 51/56* (2006.01)

(52) U.S. Cl.
CPC ...... *H01L 51/5268* (2013.01); *H01L 51/5253* (2013.01); *H01L 51/5262* (2013.01);
(Continued)

(58) Field of Classification Search
CPC ............ H01L 51/5268; H01L 51/5271; H01L 51/5275
See application file for complete search history.

(56) References Cited

U.S. PATENT DOCUMENTS 6,608,439 B1 * 8/2003 Sokolik ................. B82Y 20/00
313/504
9,960,387 B2 5/2018 Choi et al.
(Continued)

FOREIGN PATENT DOCUMENTS

| CN | 1964095 A | 5/2007 |
| CN | 103633109 A | 3/2014 |

(Continued)

*Primary Examiner* — Shaun M Campbell
*Assistant Examiner* — Suberr L Chi
(74) *Attorney, Agent, or Firm* — Brinks Gilson & Lione

(57) ABSTRACT

The present disclosure provides a package structure of an organic light emitting component and a method for manufacturing the same. The package structure includes: a substrate, provided with light emitting pixels; a first barrier layer, arranged on the substrate; a nanoparticle layer, arranged on a portion of the first barrier layer corresponding to a location of the light emitting pixels, wherein the nanoparticle layer is configured to extract light from the light emitting pixels; a buffer layer, arranged on another portion of the first barrier layer where the nanoparticle layer is not set; a second barrier layer, arranged on the nanoparticle layer and the buffer layer. The implementation of the present disclosure allows the light extraction to be applied only on the light emitting pixels. Therefore, it can avoid the waste of material and reduce production cost.

4 Claims, 2 Drawing Sheets

(52) U.S. Cl.
CPC ........ *H01L 51/56* (2013.01); *H01L 2251/303* (2013.01); *H01L 2251/5369* (2013.01)

(56) References Cited

U.S. PATENT DOCUMENTS

| | | | |
|---|---|---|---|
| 2007/0077349 A1 | 4/2007 | Newman et al. | |
| 2007/0200492 A1* | 8/2007 | Cok | H01L 27/322 313/506 |
| 2008/0018231 A1* | 1/2008 | Hirakata | H01L 51/5246 313/498 |
| 2008/0042552 A1* | 2/2008 | Cok | B82Y 20/00 313/501 |
| 2008/0084150 A1* | 4/2008 | Cok | B82Y 20/00 313/110 |
| 2008/0297045 A1 | 12/2008 | Cok | |
| 2012/0104372 A1 | 5/2012 | Kim et al. | |
| 2013/0320842 A1* | 12/2013 | Park | H05B 33/12 313/512 |
| 2016/0379964 A1 | 12/2016 | Wang et al. | |

FOREIGN PATENT DOCUMENTS

| | | |
|---|---|---|
| CN | 104538430 A | 4/2015 |
| CN | 104576703 A | 4/2015 |
| CN | 105789484 A | 7/2016 |
| CN | 107331792 A | 11/2017 |

\* cited by examiner

PACKAGE STRUCTURE OF ORGANIC LIGHT EMITTING COMPONENT

CROSS-REFERENCE TO RELATED APPLICATIONS

The present application is a continuation-application of International (PCT) Patent Application No. PCT/CN2018/077085, filed on Feb. 24, 2018, which claims foreign priority of Chinese Patent Application No. 201711439706.8, filed on Dec. 26, 2017 in the State Intellectual Property Office of China, the entire contents of which are hereby incorporated by reference.

TECHNICAL FIELD

The present disclosure generally relates to the display field, and in particular to a package structure of organic light emitting component and a method for manufacturing the same.

BACKGROUND

Nowadays, the organic light emitting diode (OLED) technique has been widely used in the lighting products and display panels. OLED component is thin and light, and has several advantages such as low start-up voltage. The application of OLED technique may consume less energy, make the panel thinner and lighter, and provide front light source.

The flexible organic light emitting diode is currently a main search direction. During its fabrication, thin film packaging technique is employed. However, due to the difference of thicknesses between the pixel zones and non-pixel zones, the layers formed during the thin film packaging may not be flat, which may lead to cracks at the fringe of light emitting zones and failure of the component.

SUMMARY

The present disclosure provides a package structure of organic light emitting component and a method for manufacturing the same.

To solve the above-mentioned problem, a technical scheme adopted by the present disclosure is to provide a method for manufacturing a package structure of an organic light emitting component. The method may include: preparing a substrate provided with light emitting pixels; setting a first barrier layer on the substrate provided with the light emitting pixels; setting a nanoparticle layer on a portion of the first barrier layer corresponding to a location of the light emitting pixels, wherein the nanoparticle layer is configured to extract light from the light emitting pixels; setting a buffer layer on another portion of the first barrier layer where the nanoparticle layer is not set; and setting a second barrier layer on the buffer layer and the nanoparticle layer; wherein, a thickness of the buffer layer is no less than a sum of a thickness of the nanoparticle layer and a thickness of the first barrier layer at the location of the light emitting pixels; wherein the nanoparticle layer is formed by evaporation or spray.

To solve the above-mentioned problem, a technical scheme adopted by the present disclosure is to provide a package structure of an organic light emitting component. The package structure may include: a substrate, provided with light emitting pixels; a first barrier layer, arranged on the substrate; a nanoparticle layer, arranged on a portion of the first barrier layer corresponding to a location of the light emitting pixels, wherein the nanoparticle layer is configured to extract light from the light emitting pixels; a buffer layer, arranged on another portion of the first barrier layer where the nanoparticle layer is not set; and a second barrier layer, arranged on the nanoparticle layer and the buffer layer.

To solve the above-mentioned problem, a technical scheme adopted by the present disclosure is to provide a method for manufacturing a package structure of an organic light emitting component. The method may include: preparing a substrate provided with light emitting pixels; setting a first barrier layer on the substrate provided with the light emitting pixels; setting a nanoparticle layer on a portion of the first barrier layer corresponding to a location of the light emitting pixels, wherein the nanoparticle layer is configured to extract light from the light emitting pixels; setting a buffer layer on another portion of the first barrier layer where the nanoparticle layer is not set; and setting a second barrier layer on the buffer layer and the nanoparticle layer.

The present disclosure provides a package structure of organic light emitting structure and a method for manufacturing the same. By setting the nanoparticle layer corresponding to the light emitting pixels, the implementation of the present disclosure allows the light extraction to be applied only on the light emitting pixels. Therefore, it can improve the light extraction efficiency and the light emitting efficiency of the component, and avoid the waste of material and reduce production cost.

DETAILED DESCRIPTION

The disclosure will now be described in detail with reference to the accompanying drawings and examples. Apparently, the embodiments described below are only a part but not all of the embodiments of the present disclosure. All other embodiments obtained by a person of ordinary skill in the art based on the embodiments of the present disclosure without creative efforts shall fall within the protection scope of the present invention.

Figure 1:
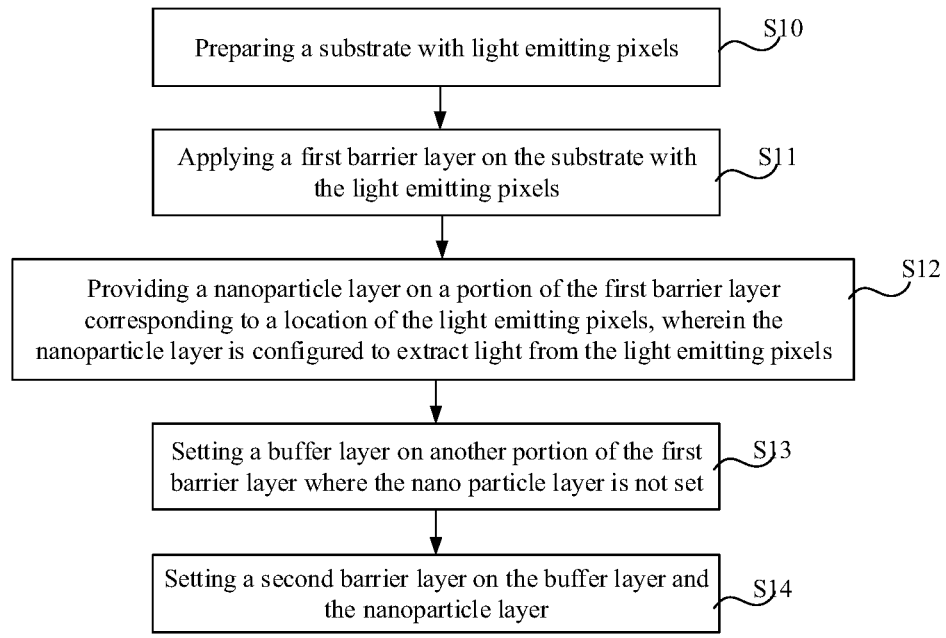
FIG. 1 is a flow chart of the method for manufacturing a package structure of an organic light emitting component according to an embodiment of the present disclosure.

Referring to FIG. 1, FIG. 1 is a flow chart of the method for manufacturing a package structure of an organic light emitting component according to an embodiment of the present disclosure. The method may include the following blocks.

S10: Preparing a substrate provided with light emitting pixels.

Figure 2:
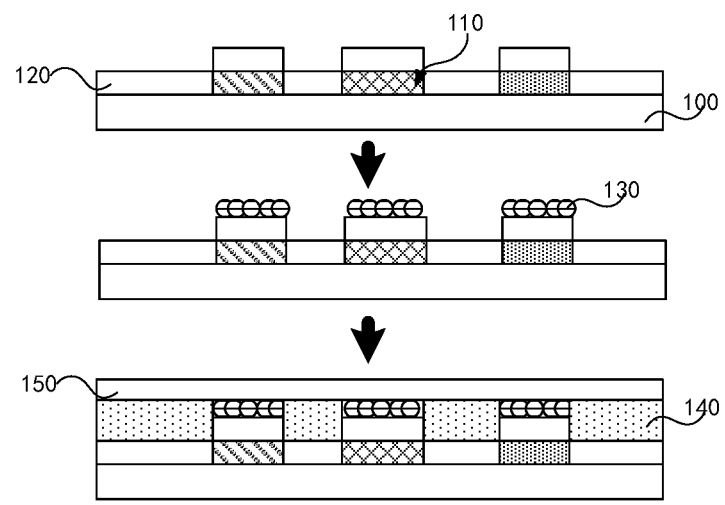
FIG. 2 shows a diagram of the fabrication processes of the package structure of the organic light emitting component.

Referring also to FIG. 2, FIG. 2 shows a diagram of the fabrication processes of the package structure of the organic light emitting component. In S10, a substrate 100 is firstly provided. The substrate 100 may be made of transparent material. Specifically, it can be made of (but not limited to) glass, ceramic or transparent plastic.

The light emitting pixels 110 may be arranged on the substrate 100. The fabrication process of the light emitting pixels 100 may be similar to that of prior art, and will not be described hereon.

S11: Applying a first barrier layer on the substrate provided with the light emitting pixels.

Applying a first barrier layer 120 on the above-mentioned substrate 100 with light emitting pixels 110. The first barrier layer 120 is configured to prevent water and oxygen. The first barrier layer 120 may be made of material specifically utilized for preventing water and oxygen such as polyethylene terephthalate (PET) and inorganic thin film.

S12: Setting a nanoparticle layer on a portion of the first barrier layer corresponding to a location of the light emitting pixels, wherein the nanoparticle layer is configured to extract light from the light emitting pixels.

In this embodiment, a nanoparticle layer 130 may be set on a portion of the first barrier layer 120 which corresponds to the location of the light emitting pixels 110. Specifically, before setting the nanoparticle layer 130, a mask may be utilized to cover another portion of the first barrier layer 120 where the light emitting pixels are not set. Then the nanoparticle layer 130 may be formed on the portion of the first barrier layer 120 corresponding to the light emitting pixels 110. The nanoparticle layer 130 may be configured to extract light only from each kind of the light emitting pixels 110.

In one embodiment, the nanoparticle layer 130 may be formed on the portion of the first barrier layer 120 corresponding to the light emitting pixels 110 by evaporation or spray. The nanoparticle layer 130 may be made of metal oxide with large particle radius, such as one of magnesium oxide, calcium oxide and zirconium oxide. Light emitted from the light emitting pixels 110 may enter into the nanoparticle layer 130 such that the total reflection condition is changed. Thus, more light may be refracted out. Therefore, the light extraction efficiency of the nanoparticle layer 130 may be improved so as the light emitting efficiency of the organic light emitting component.

Moreover, in this embodiment, the nanoparticle layer 130 is arranged in correspondence with the light emitting pixels 110 such that it may extract light only from each kind of the light emitting pixels 110. Therefore the implementation of the present disclosure may avoid waste of material and reduce production cost.

S13: Setting a buffer layer on another portion of the first barrier layer where the nanoparticle layer is not set.

Further, the buffer layer 140 may be set on another portion of the first barrier layer 120 where the nanoparticle layer 130 is not set. The buffer layer 140 may be configured to relieve bending stress, and to make the structure flat and flexible. In this embodiment, the buffer layer 140 may be made of (but not limited to) silicon oxide (SiOx) and silicon nitride (SiNx). The buffer layer 140 may be formed by coating or inkjet printing.

If it exists a difference of thicknesses between the pixel zones and non-pixel zones, the thin film packaging may not be flat, which may lead to cracks at the fringe of light emitting zones and failure of the component. In order to solve this problem, in this embodiment, the thickness of the buffer layer 140 may be set to be no less than a sum of a thickness of the nanoparticle layer 130 and a thickness of the first barrier layer 120 at the location of the light emitting pixels 110. Specifically, the thickness of the buffer layer 140 may be equal to a sum of a thickness of the nanoparticle layer 130 and a thickness of the first barrier layer 120 at the location of the light emitting pixels 110. Correspondingly, according to this embodiment, the packaging may be enhanced and problem due to the difference of thicknesses may be avoided.

S14: Setting a second barrier layer on the buffer layer and the nanoparticle layer.

After the buffer layer 140 is formed, the second barrier layer 150 may be set on the buffer layer 140 and the nanoparticle layer 130. The second barrier layer 150 may be configured to prevent water and oxygen, and be made of material specifically utilized for preventing water and oxygen such as polyethylene terephthalate (PET) and inorganic thin film.

By setting the nanoparticle layer corresponding to the light emitting pixels, the above embodiments allow the light extraction to be applied only on the light emitting pixels such that it can avoid the waste of material and reduce production cost. By setting the thickness of the buffer layer equal to the sum of the thicknesses of the nanoparticle layer and the first barrier layer at the location of the light emitting pixels, the packaging may be enhanced and the problem due to the difference of thicknesses may be avoided.

Figure 3:
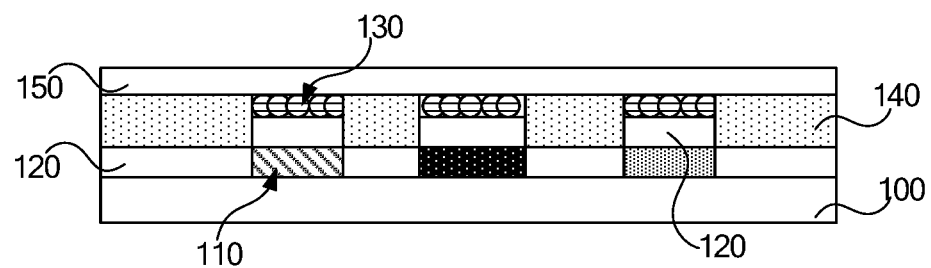
FIG. 3 is a schematic diagram of the package structure of an organic light emitting component according to an embodiment of the present disclosure.

Referring to FIG. 3, FIG. 3 is a schematic diagram of the package structure of an organic light emitting component according to an embodiment of the present disclosure. In this embodiment, the package structure may include a substrate 100, light emitting pixels 110, a first barrier layer 120, a nanoparticle layer 130, a buffer layer 140 and a second barrier layer 150.

The substrate 100 may be made of transparent material. Specifically, it can be made of (but not limited to) glass, ceramic or transparent plastic. The light emitting pixels 110 may be provided on the substrate 100.

The first barrier layer 120 may be set on the substrate 100 and configured to prevent water and oxygen. The first barrier layer 120 may be made of material specifically utilized for preventing water and oxygen such as polyethylene terephthalate (PET) and inorganic thin film.

The nanoparticle layer 130 may be formed on the portion of the first barrier layer 120 corresponding to the light emitting pixels 110. The nanoparticle layer 130 is configured to extract light only from each kind of the light emitting pixels 110. Optionally, the nanoparticle layer 130 may be made of metal oxide with large particle radius, such as one of magnesium oxide, calcium oxide and zirconium oxide. Light emitted from the light emitting pixels 110 may enter into the nanoparticle layer 130 such that the total reflection condition is changed. Thus, more light may be refracted out. Therefore, the light extraction efficiency of the nanoparticle layer 130 may be improved so as the light emitting efficiency of the organic light emitting component.

The buffer layer 140 may be set on another portion of the first barrier layer 120 where the nanoparticle layer 130 is not set. The buffer layer 140 may be configured to relieve bending stress, and to make the structure flat and flexible. In this embodiment, the buffer layer 140 may be made of (but not limited to) silicon oxide (SiOx) and silicon nitride (SiNx).

The second barrier layer 150 may be set on the nanoparticle layer 130 and the buffer layer 140. The second barrier layer 150 may be configured to prevent water and oxygen, and be made of material specifically utilized for preventing water and oxygen such as polyethylene terephthalate (PET) and inorganic thin film.

The process and method for manufacturing the substrate, the light emitting pixels, the first barrier layer, the nanoparticle layer, the buffer layer and the second barrier layer may be found in the embodiments associated with the manufacturing method of the present disclosure, and will not be described hereon.

In conclusion, the present disclosure provides a package structure of organic light emitting structure and a method for manufacturing the same. By setting the nanoparticle layer corresponding to the light emitting pixels, the implementation of the present disclosure allows the light extraction to be applied only on the light emitting pixels. Therefore, it can improve the light extraction efficiency and the light emitting efficiency of the component, and avoid the waste of material and reduce production cost. By setting the thickness of the buffer layer equal to the sum of the thicknesses of the nanoparticle layer and the first barrier layer at the location of the light emitting pixels, the packaging may be enhanced and the problem due to the difference of thicknesses may be avoided.

The foregoing is merely embodiments of the present disclosure, and is not intended to limit the scope of the disclosure. Any transformation of equivalent structure or equivalent process which uses the specification and the accompanying drawings of the present disclosure, or directly or indirectly application in other related technical fields, are likewise included within the scope of the protection of the present disclosure.

What is claimed is:

1. A package structure of an organic light emitting component, comprising:
   a substrate;
   a plurality of light emitting pixels, arranged on the substrate and spaced from each other;
   a first barrier layer, comprising a plurality of first parts spaced from each other and a plurality of second parts spaced from each other, wherein each first part is adjacent to a corresponding second part, each first part covers and contacts with a part of the substrate which is not covered by the plurality of light emitting pixels, each second part covers and is contacts with a side of the plurality of light emitting pixels away from the substrate;
   a nanoparticle layer, arranged on and in contact with a side of the plurality of second parts wherein the nanoparticle layer is configured to extract light from the light emitting pixels;
   a buffer layer, arranged on the plurality of first parts not covered by the nanoparticle layer and not covering a side of the nanoparticle layer away from the substrate; and
   a second barrier layer, arranged on and in contact with a side of the nanoparticle layer and the buffer layer away from the substrate.

2. The package structure of claim 1, wherein the thickness of the buffer layer is greater than or equal to the sum of the thickness of the nanoparticle layer and the thickness of a first barrier layer at the location of the plurality of light emitting pixels.

3. The package structure of claim 1, wherein the nanoparticle layer comprises metal oxide material.

4. The package structure of claim 3, wherein the nanoparticle layer further comprises one of magnesium oxide, calcium oxide and zirconium oxide.

* * * * *